United States Patent
Reeves et al.

(10) Patent No.: US 10,531,594 B2
(45) Date of Patent: *Jan. 7, 2020

(54) METHOD OF PRODUCING A LIQUID COOLED COLDPLATE

(71) Applicant: Wolverine Tube, Inc., Decatur, AL (US)

(72) Inventors: Matthew A. Reeves, Bend, OR (US); Robert Scott Holland, San Diego, CA (US); Sy-Jenq Loong, Madison, AL (US)

(73) Assignee: Wieland Microcool, LLC, Decatur, AL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/786,179

(22) Filed: Oct. 17, 2017

(65) Prior Publication Data

US 2018/0042137 A1 Feb. 8, 2018

Related U.S. Application Data

(63) Continuation-in-part of application No. 15/155,568, filed on May 16, 2016, now Pat. No. 9,795,057.
(Continued)

(51) Int. Cl.
*H01R 43/00* (2006.01)
*H05K 7/20* (2006.01)
(Continued)

(52) U.S. Cl.
CPC .......... *H05K 7/20254* (2013.01); *B21J 5/12* (2013.01); *H01L 21/4878* (2013.01);
(Continued)

(58) Field of Classification Search
CPC ......... H01L 2225/06589; H01L 23/367; H01L 21/4882; Y10T 156/10; Y10T 29/49826;
(Continued)

(56) References Cited

U.S. PATENT DOCUMENTS 3,481,393 A 12/1969 Chu
3,979,042 A 9/1976 Peters
(Continued)

FOREIGN PATENT DOCUMENTS

CN 2696126 Y 4/2005
CN 201623026 U 11/2010
(Continued)

OTHER PUBLICATIONS

"DBC (Direct Bond Copper) Substrate and DPC (Direct Plated Copper) Substrate," Mar. 16, 2009. 9 pages.
(Continued)

*Primary Examiner* — Thiem D Phan
(74) *Attorney, Agent, or Firm* — McDonald Hopkins, LLC

(57) ABSTRACT

A liquid cooled coldplate has a tub with an inlet port and an outlet port and a plurality of pockets recessed within a top surface of the tub. Each pocket has a peripheral opening and a ledge, the ledge disposed inwardly and downwardly from the peripheral opening. The inlet port and outlet port are in fluid communication with the pocket via an inlet slot and an outlet slot. A plurality of cooling plates are each received by a pocket and recessed within the pocket. Each cooling plate comprises an electronics side for receiving electronics and enhanced side for cooling the cooling plate. The enhanced side of the cooling plate comprises a plurality of pins formed by micro deformation technology. The tub may be formed by extrusion.

17 Claims, 11 Drawing Sheets

Related U.S. Application Data which is a continuation-in-part of application No. 14/307,074, filed on Jun. 17, 2014, now Pat. No. 9,655,294, which is a continuation of application No. 13/191,281, filed on Jul. 26, 2011, now abandoned, application No. 15/786,179, filed on Oct. 17, 2017, which is a continuation-in-part of application No. 13/601,206, filed on Aug. 31, 2012, now Pat. No. 9,681,580, and a continuation-in-part of application No. 13/191,281, filed on Jul. 26, 2011, now abandoned.

(60) Provisional application No. 61/368,475, filed on Jul. 28, 2010, provisional application No. 61/530,575, filed on Sep. 2, 2011.

(51) Int. Cl.
    B21J 5/12      (2006.01)
    H01L 21/48     (2006.01)
    H05K 1/03      (2006.01)
    H05K 3/00      (2006.01)

(52) U.S. Cl.
    CPC ....... *H05K 7/20927* (2013.01); *H05K 1/0306* (2013.01); *H05K 3/0061* (2013.01); *Y10T 29/49169* (2015.01)

(58) Field of Classification Search
    CPC ............. Y10T 29/4935; Y10T 29/4913; Y10T 29/49359; Y10T 29/49169; F21V 29/20; F28F 2215/00; G02B 6/3814; F28D 15/00; F28D 2021/0029; H05K 1/0203; H05K 7/20154; H05K 7/2039; H01J 61/523
    USPC ..... 29/854, 557, 832, 840, 890.03, 890.046, 29/890.049, 890.05; 361/688, 689, 699, 361/704, 706, 707, 679.54, 701, 702, 361/709–711
    See application file for complete search history.

(56) References Cited

U.S. PATENT DOCUMENTS

| | | | |
|---|---|---|---|
| 5,021,924 A | 6/1991 | Kieda | |
| 5,183,104 A | 2/1993 | Novotny | |
| 5,270,572 A | 12/1993 | Nakajima | |
| 5,386,500 A | 1/1995 | Pomerantz | |
| 5,453,911 A | 9/1995 | Wolgemuth | |
| 5,563,447 A | 10/1996 | Lake | |
| 5,775,187 A * | 7/1998 | Nikolai | B21C 37/207 407/113 |
| 5,796,049 A | 8/1998 | Schneider | |
| 5,801,442 A | 9/1998 | Hamilton | |
| 5,818,692 A | 10/1998 | Denney | |
| 5,998,240 A | 12/1999 | Hamilton | |
| 6,020,637 A | 2/2000 | Kamezos | |
| 6,233,149 B1 | 5/2001 | Bailey | |
| 6,250,127 B1 | 6/2001 | Polese | |
| 6,284,389 B1 | 9/2001 | Jones | |
| 6,400,012 B1 | 6/2002 | Miller | |
| 6,457,514 B1 | 10/2002 | Fumi | |
| 6,578,626 B1 | 6/2003 | Calaman | |
| 6,594,149 B2 | 7/2003 | Yamada | |
| 6,644,395 B1 | 11/2003 | Bergin | |
| 6,912,130 B2 * | 6/2005 | Osanai | H01L 23/3735 165/104.33 |
| 6,986,382 B2 | 1/2006 | Upadhya | |
| 6,988,534 B2 | 1/2006 | Kenny | |
| 6,989,991 B2 | 1/2006 | Barson | |
| 7,017,654 B2 | 3/2006 | Kenny | |
| 7,104,312 B2 | 9/2006 | Goodson | |
| 7,178,586 B2 | 2/2007 | Goldman | |
| 7,188,662 B2 | 3/2007 | Brewer | |
| 7,190,581 B1 | 3/2007 | Hassani | |
| 7,197,819 B1 | 4/2007 | Rinehart | |
| 7,203,064 B2 | 4/2007 | Mongia | |
| 7,215,545 B1 | 5/2007 | Moghaddam | |
| 7,277,284 B2 | 10/2007 | Lee | |
| 7,464,747 B2 | 12/2008 | Nakahama | |
| 7,557,438 B2 | 7/2009 | Chrysler | |
| 7,564,129 B2 | 7/2009 | Nakanishi | |
| 7,709,099 B2 | 5/2010 | Yokoyama | |
| 7,749,430 B2 | 7/2010 | Fukui | |
| 7,755,185 B2 | 7/2010 | Bayerer | |
| 7,836,597 B2 | 11/2010 | Datta | |
| 7,859,103 B2 | 12/2010 | Aoki | |
| 7,884,468 B2 | 2/2011 | Mann | |
| 8,081,465 B2 | 12/2011 | Nishiura | |
| 8,712,598 B2 | 4/2014 | Dighde | |
| 9,003,649 B1 | 4/2015 | Romero | |
| 2002/0006526 A1 | 1/2002 | Polese | |
| 2002/0036881 A1 | 3/2002 | Shamouilian | |
| 2004/0062009 A1 * | 4/2004 | Osanai | H01L 23/3735 361/709 |
| 2006/0248918 A1 | 11/2006 | Robertson | |
| 2006/0291165 A1 | 12/2006 | Flesch | |
| 2007/0222042 A1 | 9/2007 | Lee | |
| 2008/0291640 A1 | 11/2008 | Chen | |
| 2010/0127383 A1 | 5/2010 | Oka | |
| 2010/0147492 A1 | 6/2010 | Conry | |
| 2010/0172091 A1 | 7/2010 | Nishiura | |
| 2010/0206537 A1 | 8/2010 | Ikeda | |
| 2010/0314072 A1 | 12/2010 | Lee | |
| 2010/0326750 A1 | 12/2010 | Murakami | |
| 2011/0079376 A1 | 4/2011 | Loong | |
| 2012/0026692 A1 | 2/2012 | Loong | |
| 2012/0320529 A1 | 12/2012 | Loong | |
| 2014/0001430 A1 | 1/2014 | Miller | |
| 2014/0290042 A1 | 10/2014 | Loong | |

FOREIGN PATENT DOCUMENTS

| | | |
|---|---|---|
| DE | 19960840 A1 | 7/2001 |
| DE | 102006019376 A1 | 10/2007 |
| JP | 9298259 | 11/1997 |
| JP | H09298259 A | 11/1997 |
| JP | 11097587 | 4/1999 |
| JP | 2001257297 A | 9/2001 |
| JP | 2007012722 A | 1/2007 |
| JP | 2008098493 A | 4/2008 |
| JP | 2008205383 A | 9/2008 |
| JP | 2009054731 A | 3/2009 |
| KR | 10-2009-0062139 | 6/2009 |
| WO | WO2010020438 A1 | 2/2010 |

OTHER PUBLICATIONS

Kris Vasoya; EVP Engineering. Thermal Works L.P.; "Reducing Hot Spots and Junction Temperatures of Integrated Circuits Using Carbon Composite in a Printed Circuit Board and Substrate," 22nd IEEE Semi-Therm Symposium, 2006, pp. 237-239.

Tien-Yu (Tom) Lee; "Design Optimization of an Integrated Liquid-Cooled IGBT Power Module Using CFD Technique," IEEE Transactions on Components and Packaging Technologies, vol. 23, No. 1, Mar. 2000, pp. 55-60.

Charlotte Gillot et al., "Integrated Single and Two-Phase Micro Heat Sinks Under IGBT Chips," IEEE Transactions on Components and Packaging Technology, vol. 22, No. 3, Sep. 1999, pp. 384-389.

International Search Report and Written Opinion dated Apr. 6, 2012 in related International Application No. PCT/US2011/045623 filed on Jul. 27, 2011.

International Search Report and Written Opinion dated Feb. 20, 2013 in related International Application No. PCT/US2012/053451 filed Aug. 31, 2012.

International Search Report and Written Opinion dated Aug. 25, 2016 in corresponding International Application No. PCT/US2016/0032730 filed May 16, 2016, 16 pages.

(56) References Cited

OTHER PUBLICATIONS

European Search Report and Written Opinion dated Aug. 11, 2016 in corresponding European Application No. 12828955.0 filed Aug. 31, 2012, 9 pages.

* cited by examiner

METHOD OF PRODUCING A LIQUID COOLED COLDPLATE

REFERENCE TO RELATED APPLICATIONS

The present application claims priority to U.S. Provisional Patent Application 62/162,195, filed May 15, 2015, titled "Liquid Cooled Coldplate." The present application also claims priority to U.S. Provisional Patent Application No. 62/332,733, filed May 6, 2016, titled "Liquid Cooled Coldplate with Clad Fin Plates." The present application is also a continuation-in-part of, and claims priority to, U.S. Non-Provisional patent application Ser. No. 15/155,568, filed May 16, 2016, titled "Method of Producing a Liquid Cooled Coldplate," which is a continuation-in-part of U.S. Non-Provisional patent application Ser. No. 14/307,074, filed Jun. 17, 2014, titled "Electronics Substrate with Enhanced Direct Bonded Metal," which is a continuation of, and claims priority to, U.S. Non-Provisional patent application Ser. No. 13/191,281, filed Jul. 26, 2011, titled "Electronics Substrate with Enhanced Direct Bonded Metal," which claims priority to U.S. Provisional Application No. 61/368,475, filed Jul. 28, 2010, titled "Electronics Substrate with Enhanced Direct Bonded Metal." The present application is also a continuation-in-part of, and claims priority to, U.S. Non-Provisional patent application Ser. No. 13/601,206, filed Aug. 31, 2012, titled "Enhanced Clad Metal Base Plate," which claims priority to U.S. Provisional Application No. 61/530,575, filed Sep. 2, 2011, titled "Enhanced Clad Metal Base Plate." U.S. Non-Provisional patent application Ser. No. 13/601,206, filed Aug. 31, 2012 is also a continuation-in-part of, and claims priority to, U.S. Non-Provisional patent application Ser. No. 13/191,281, filed Jul. 26, 2011, which claims priority to U.S. Provisional Application No. 61/368,475, filed Jul. 28, 2010. The contents of all of these applications are herein incorporated by reference in their entirety.

BACKGROUND AND SUMMARY

Certain electronic devices generate heat as they operate, and in some cases this heat has to be removed or dissipated for the device to continue operating properly. Several techniques have been used to cool electronic equipment. Examples include fans, which are used to blow air over electronic equipment. This air serves to convectively cool the electronic equipment with normal ambient air. Other techniques that have been used include liquid cold plates. Liquid cold plates are plates with channels through which liquid flows. The electronic equipment is mounted in contact with a liquid cold plate and the heat generated by the electronic equipment is transferred to the liquid coolant inside the plate. This can provide better cooling than the convective cooling provided by a fan with considerably less flow volume. It can also provide better temperature consistency with less acoustic noise.

Cold plates can be directly affixed to a heat-producing piece of electronic equipment, such as an electronic chip or an insulated gated bipolar transistor (IGBT). It is also possible to use thermal grease or other heat transfer aid between the electronic equipment and the cold plate to improve heat transfer. Typically, the cold plate includes an inlet and an outlet for liquid coolant flow. The liquid coolant absorbs the heat produced by the electronic equipment, and transfers the absorbed heat to the coolant which then flows out of the cold plate. Many cold plates provide cooling with a relatively low flow of liquid coolant. They can provide better temperature consistency than convective cooling, minimal acoustic noise and the cooling power of liquid coolants.

Several factors impact the performance and desirability of cold plates, and different factors are important for different uses. Some important factors include cost of production and ease of producing relatively large quantities. Cooling efficiency should be high, and cold plates should be securely sealed to prevent any leak of liquid coolant onto the electronic equipment being cooled.

In some applications, the coolant may not be particularly clean, which can result in plugging of the cold plate. For example, a cold plate used in an automobile may utilize the anti-freeze liquid for cooling, and the anti-freeze can contain small particulates. In other applications, there may be a phase transfer within a cold plate to help facilitate cooling. It is also possible for a cold plate to be used for heating a component by replacing the coolant with a heating fluid. One primary difference between a coolant and a heating fluid in one phase heat transfer is that the temperature of a coolant is lower than the item being cooled, and the temperature of a heating fluid is higher than the item being cooled.

Many different techniques are used to cool electronic components, and new techniques which provide cooling benefits are desirable.

A method of producing a liquid cooled coldplate comprises forming a tub (manifold) from metal, the tub comprising an inlet port, and outlet port, and a plurality of pockets. The pockets are in fluid communication with the inlet port and outlet port via slots that can be tuned to ensure parallel flow rate in the channels through the pockets. Cooling plates on the surface of the tub are formed by slicing fins into flat metal plates with a tool to form an enhanced surface, where the tool slices into the cooling metal layer to a depth less than the cooling metal layer thickness, and where the slicing step forces sliced material upwards without removing material from the cooling metal layer. The fins are sliced at an angle to form pins which extend beyond an outer surface of the cooling plates. Each cooling plate is installed into a pocket such that the pinned surface is in fluid communication with the pockets, the inlet port, and the outlet port. Electronic components can then be installed on the flat surfaces of the cooling plates.

DETAILED DESCRIPTION

Heat Transfer Fundamentals

Figure 1:
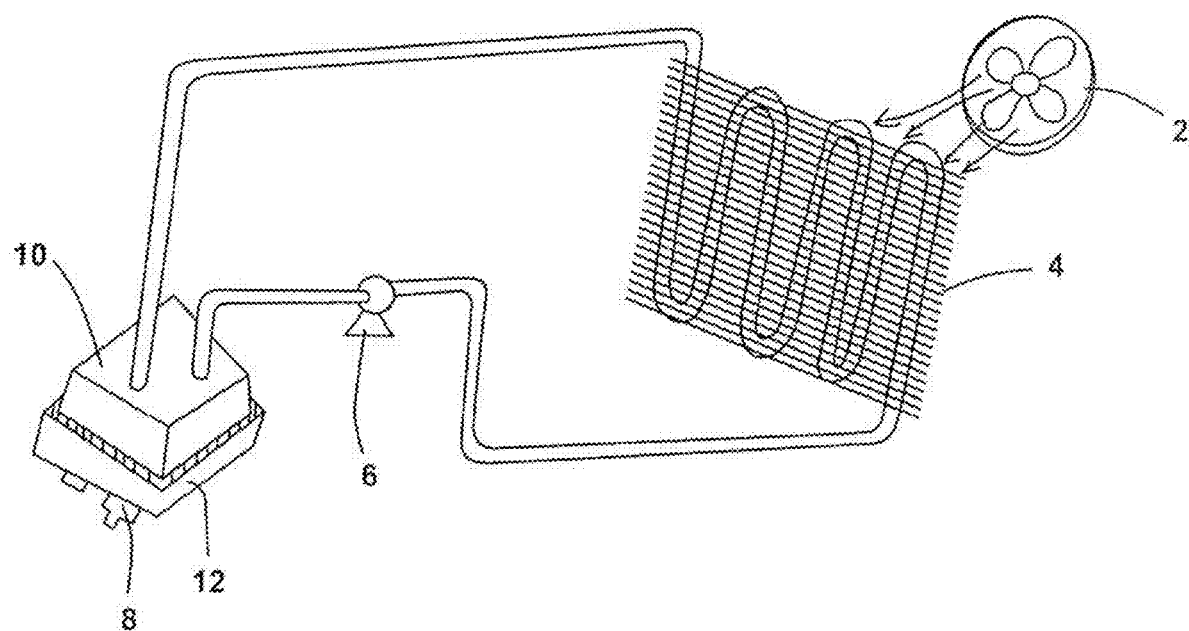
FIG. 1 shows a schematic diagram of one embodiment of a cooling system.

There are several ways to cool electronic equipment. Often times, electronic equipment is cooled with fans which blow air over the electronic equipment. This air provides convective cooling which does help to control the heat generated by the electronic equipment. However, liquid cooling can provide greater cooling capacity than air flow in many situations.

Liquids can provide better cooling than gases for several reasons. For example, liquids are denser than gases so more thermal mass is available to absorb heat from the electronic equipment. Also, liquids generally have higher thermal conductivities so heat will transfer into and through the liquid more rapidly than heat will transfer into and through a gas. Furthermore, liquids tend to have a higher specific heat than gases so a set quantity of liquid will absorb and transfer more heat than a comparable amount of gas. Because of this, when electronic equipment is utilized which produces large amounts of heat, many manufacturers desire the use of liquid cooling devices.

Liquid cooling systems include at least a liquid coolant and an article or substance that is cooled. Often, there is a barrier between the liquid coolant and the item being cooled, and heat must be transferred through this barrier. In some instances, the barrier can include multiple components and layers. A barrier between the item being cooled and the liquid coolant is generally desired for electronic equipment, because direct contact with liquids can damage some electronic components. Minimizing the resistance to heat flow through the barrier between the item being cooled and the liquid coolant improves the cooling efficiency.

Two significant forms of resistance to heat flow through a barrier include resistance through one material, and resistance across an interface between two separate components or parts. Resistance to heat flow through a single material is minimized if the material is a heat conductor, instead of a heat insulator. Copper is one material that can be used in a barrier, because it is a good conductor of heat and it is relatively malleable. However, other materials can also be used, including aluminum, steel and other metals, graphite, ceramics, and even insulating materials like plastic or air.

Another source of resistance to heat flow is at the interface between two components or parts. Typically, when heat flows from a first component to another component which contacts the first, there is a resistance to heat flow between the two components. Reducing the number of interfaces can improve heat transfer rates. Also, when two materials form an interface, there can be air trapped between the two materials, and air is an insulator that tends to hinder heat transfer. Thermal grease can be used to facilitate heat transfer between two different components or layers in a barrier, but a single heat transfer layer is typically more efficient than two separate layers even when thermal grease or other heat transfer agents are used.

It is also desirable to maximize the surface area where the cooling liquid contacts the barrier because the larger the surface area, the more area available to transfer heat. The use of fins, pins, or other structures on a surface contacting the liquid coolant can increase the surface area and improve heat transfer. Surface area can be further increased by increasing the number of fins, pins, or other structures, or by increasing the surface area of each fin, pin, or structure. A surface with fins, pins, or other structures to improve heat transfer is said to be "enhanced," so the fins, pins, or other structures can be generically referred to as enhancements.

Forming enhancements directly from a heat transfer surface, instead of attaching the enhancements to the heat transfer surface, can improve heat transfer because this eliminates the interface between the base of the heat transfer surface and the enhancement. Therefore, by forming fins or other enhancements from the material of the heat transfer surface, resistance to heat flow is minimized. If one were to produce the enhancements separately and then affix them to the heat transfer surface, there would be a resistance to heat flow between the enhancements and the heat transfer surface at the interface, which would have a negative impact on the heat transfer rate. This is true even if separate enhancements and the heat transfer surface were made from the same material, such as copper. Therefore, it is preferred to form the enhancements directly from the material of the heat transfer surface such that the enhancements are an extension of the heat transfer surface, and there is no interface between the enhancements and heat transfer surface. This is referred to as having the enhancements "monolithic" with the heat transfer surface.

In some cases, liquids will flow across a solid in what is referred to as laminar flow. In laminar flow, the layer of liquid directly contacting the solid surface remains essentially stationary at the solid surface. The layer of liquid directly above that layer moves very gradually across the first layer. The next layer up moves a little more swiftly, etc., such that the highest flow rate will be at a point relatively far from the solid surface. The lowest flow rate, which is essentially zero, will be at the solid surface. Each different layer of liquid which is sliding over the adjacent layers provides its own resistance to heat flow, and each layer can have a different temperature so the warmest liquid is often adjacent the solid surface and the coolest liquid is relatively far from the solid surface. Therefore, if the liquid can be mixed during flow, the liquid directly contacting the solid surface can absorb heat from the solid surface and then be mixed with the entire body of cooling liquid to spread the absorbed heat into the liquid more rapidly.

Turbulent flow causes liquids to mix as they flow across a solid surface, as opposed to laminar flow. This tends to keep the liquid in contact with the solid surface cooler, which facilitates a faster transfer of heat from the solid surface to the liquid. Some things which tend to increase turbulent flow include faster flow rates, uneven surfaces, projections into a flowing liquid, and various obstructions that force a liquid to change path and flow another way. To maximize turbulence, one can include sharp bends, twisting edges, pins, fins, and any of a wide variety of flow obstructions that cause rapid change in the direction of flow of a liquid. Many structures which increase turbulence can also increase pressure drop across a cold plate. Increased pressure drop can lower the flow rate, so a balance must be observed to ensure efficient heat transfer. Obstructions which tend to increase the amount of fluid flow close to the solid surface also tends to increase heat transfer, because this reduces the thickness of any stagnant liquid layer at the solid liquid interface, and it also reduces the distance heated liquid has to travel to intermix with the main body of cooling liquid.

In some embodiments, the liquid can be boiled, or vaporized, in the heat transfer process. This is referred to as two phase cooling because the coolant changes phase from a liquid to a gas in the cooling process. A liquid absorbs heat to vaporize, so the heat of vaporization of the liquid is absorbed, and this can increase the overall cooling effect. This description explains one phase cooling only, but it is to be understood that two phase cooling could also be used and is included as an embodiment of this description. Two phase cooling can require some additional components, such as a condenser to re-liquefy the coolant from a gas, as is understood by those skilled in the art. The principles discussed in this description also apply to two phase cooling.

In many electronic cooling systems, the coolant is recirculated and used repeatedly. In the embodiment shown in FIG. 1, a fan 2 is used to blow cooling air through a convective cooling device 4, and the coolant is pumped through the convective cooling device 4 by a pump 6. The coolant exiting the convective cooling device 4 is relatively cool, and is pumped through a heat transfer device 10 which is connected to an electronic component 8. The coolant is heated as the electronic component 8 is cooled, and the heated coolant is then pumped back to the convective cooling device 4 to be cooled once again.

There are many possible variations to this cooling system. For example, the coolant can be used to cool many different electronic components 8 before returning to the convective cooling device 4, and these different electronic components 8 can be connected in series, parallel, or both. The convective cooling device 4 can be replaced with a heat exchanger that cools the coolant with another liquid, such as once through cooling water. The cooling system can use once through cooling liquid, and it is even possible for the system to be used for heating components instead of cooling them because the same heat transfer principles apply to heating as to cooling.

Electronic Substrates

Figure 2:
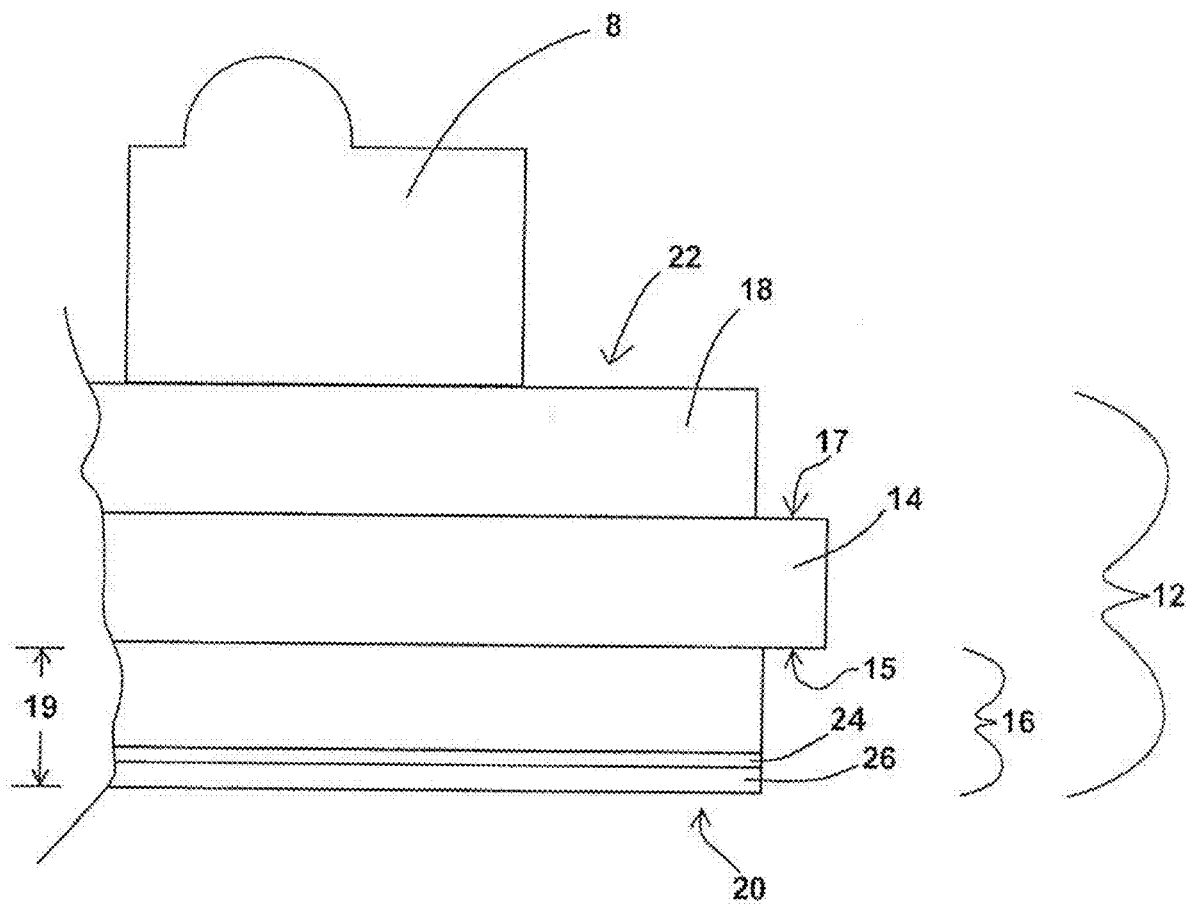
FIG. 2 depicts a side view of one embodiment of a substrate with an electronic component mounted on the substrate.

Many electronic components 8 are assembled on an electronics substrate 12, as shown in FIG. 2. The substrate 12 can provide interconnections necessary to form an electric circuit, similar to a printed circuit board. The substrate 12 can also be used to help cool the connected electronic components 8. One type of substrate 12 used is a direct bonded copper (DBC) substrate 12, where a layer of copper is directly bonded or directly plated to one or both sides of an insulating material, such as a ceramic tile 14. It may be possible to use other electrically insulating but thermally conductive materials in place of the ceramic tile 14, such as different polymers, foams, or other electrical insulators. A direct plated copper substrate 12 can also be used for electric circuits, where direct plating is an alternative method of fixing metal to a substrate 12. In this description, the term "direct bonded copper" and "DBC" are defined to include direct bonded copper and direct plated copper. Similarly, it is to be understood that references to direct bonded aluminum or other direct bonded metals also include direct plating of the metal to the substrate 12.

In some embodiments, the copper layer on one side is pre-formed or etched to form at least part of the electrical circuit, and the copper layer essentially covers the other side to help spread and transfer heat to cool the electrical components. In alternate embodiments, aluminum can be directly bonded or directly plated to a ceramic tile 14 instead of copper. It is even possible to use other metals or other materials in place of the copper or aluminum.

These directly bonded or directly plated metallic layers are referred to in this description as the cooling metal layer 16, and the electronic metal layer 18. In general, the electronic metal layer 18 can be pre-formed or etched for the electrical circuit, and the cooling metal layer 16 can be used for thermal management, but it is possible that neither metal layer 16, 18 forms part of the circuit, or both metal layers 16, 18 form part of electrical circuits. The ceramic tile 14 has an electronics face 17 opposite a cooling face 15, and the cooling metal layer 16 is directly bonded to the cooling face 15 while the electronic metal layer 18 is directly bonded to the electronic face 17.

The ceramic tile 14 can be formed from aluminum oxide ($Al_2O_3$), aluminum nitride (AlN), beryllium oxide (BeO), or other materials, and frequently has a thickness between about 0.28 millimeters (mm) and 0.61 mm, but other thicknesses are possible. The cooling and electronic metal layers 16, 18 can be a wide variety of materials, and the thickness of the metal layers 16, 18 can depend on the metal used, desired performance, and other factors. A copper layer directly bonded or directly plated to the ceramic tile 14 frequently has thicknesses ranging from 0.25 mm to 0.41 mm, but other thicknesses are possible. When an aluminum layer is directly bonded or directly plated to the ceramic tile 14, the thickness of the aluminum layer can be approximately 0.3 mm, but other thicknesses are possible. In one embodiment, the cooling metal layer 16 has a cooling metal layer thickness 19 which can be between 0.2 and 0.5 millimeters.

In some embodiments, the cooling layer outer surface 20 and/or the electronic layer outer surface 22 can have a first coating layer 24, the first coating layer 24 can have a second coating layer 26, and there can be additional coating layers as well. The cooling and electronic layer outer surfaces 20, 22 are the surfaces facing away from the ceramic tile 14. The "cooling layer outer surface 20" is defined to mean the cooling metal layer 16 outer surface before any fins or other enhancements are formed from the cooling metal layer 16, or a section of the cooling metal layer 16 which has not had any fins or enhancements formed from it. The electronic layer outer surface 22 is similarly defined, except with reference to the electronic metal layer 18 instead of the cooling metal layer 16. The first coating layer 24 can be low phosphorus electroless or electrolytic nickel, and the second coating layer 26 can be a gold layer, but other material combinations are possible. The nickel layer can be about 2 to 7 micrometers (um) thick, and the gold layer can be about 80 nanometers (nm) thick, but other thicknesses for each layer are also possible. It is also possible to directly bond a copper layer to one side of a ceramic tile 14, and an aluminum layer to the other side of the ceramic tile 14, or to use other combinations of metals for the cooling and electronic metal layer 16, 18.

The direct bonded or direct plated copper substrates 12 tend to have a relatively low coefficient of thermal expansion that is close to the coefficient of thermal expansion of silicon, due to the high bond strength of copper to the ceramic substrate 12. Many electronic components 8 contain silicon, so having a substrate 12 with a similar coefficient of thermal expansion can increase thermal cycling performance. The fact that the direct bonded or direct plated copper substrate 12 has a coefficient of thermal expansion similar to that of silicon can also reduce the need for interface layers between the substrate 12 and silicon components. The direct bonded or direct plated copper substrates 12 have many desirable characteristics known to those skilled in the art, including good heat spreading and thermal conductivity, as well as a high electrical insulation value.

Connecting the direct bonded or direct plated copper, or the direct bonded or direct plated aluminum substrates 12 to a cold plate or other coolant containing device can provide for liquid cooling. In one embodiment, heat has to transfer from the electronic component 8 to the electronic metal layer 18, then to the ceramic tile 14, then to the cooling metal layer 16, then to the wall of the cold plate, and then finally to the cooling liquid. There may also be thermal grease between the cooling metal layer 16 and the wall of the cold plate. Providing an enhanced surface on the cooling metal layer 16, and moving coolant directly past the enhanced cooling metal layer 16 would reduce the resistance to heat transfer created by the interface between the substrate 12 and the cold plate, and also the resistance to heat transfer through the barrier wall of the cold plate.

Heat Exchange Device on Electronic Substrates

Figure 3:
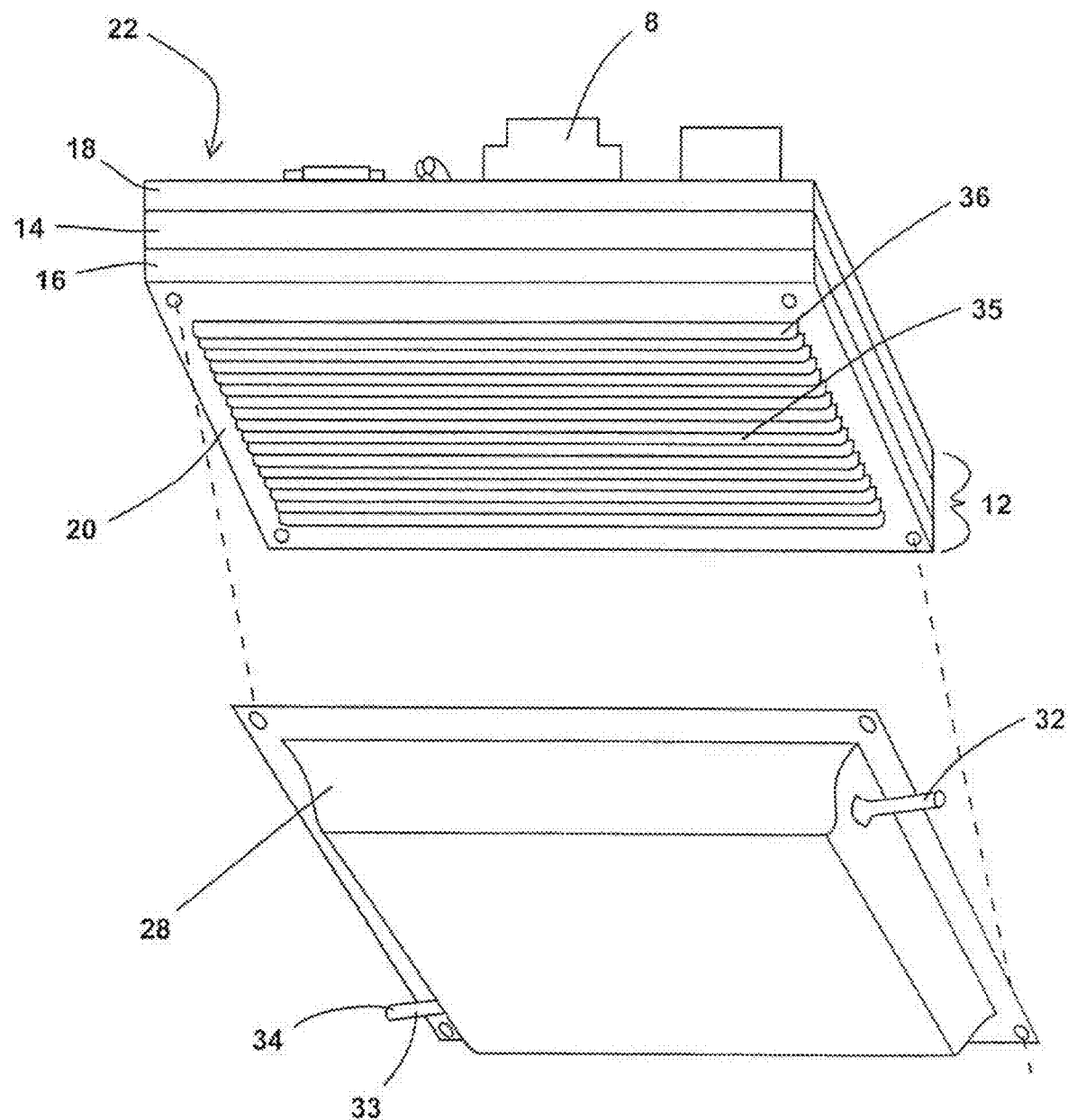
FIG. 3 is an exploded, perspective view of one embodiment of a substrate with mounted electronic components and a heat exchange device.
Figure 4:
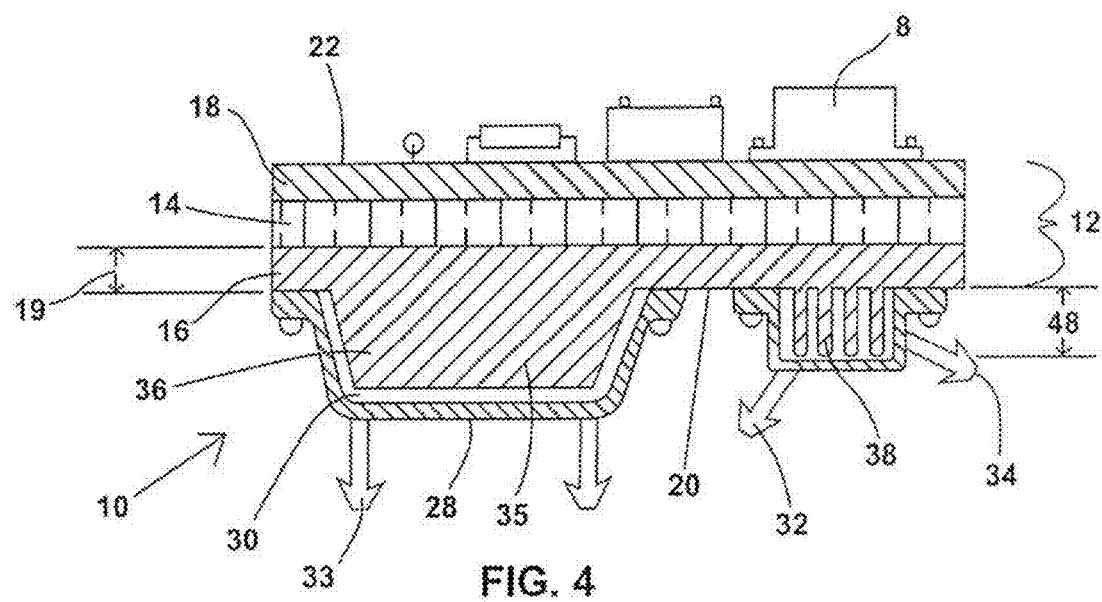
FIG. 4 is a cross-sectional side view of one embodiment of a substrate with mounted electronic components and heat exchange devices.

A heat exchange device 10 can be affixed to the substrate 12 for thermal management, as seen in FIGS. 3 and 4 with continuing reference to FIGS. 1 and 2. The heat exchange device 10 can comprise a tub 28 that is affixed to the substrate 12 to create a chamber 30 adjacent to the substrate 12. Alternatively, the chamber 30 can be made with a spacer and a cover, or many other structures which provide an enclosed space adjacent to the substrate 12. An inlet 32 and an outlet 34 are provided, where the inlet 32 and outlet 34 penetrate the chamber 30 to allow liquid to flow into and out of the chamber 30, so the inlet 32 and outlet 34 are in fluid communication through the chamber 30. The inlet 32 and outlet 34 can penetrate the tub 28, but it is also possible for one or more of the inlet 32 and outlet 34 to penetrate the substrate 12 to provide access to the chamber 30, or to penetrate any other structure used to make the chamber 30. There can be more than one inlet 32 and outlet 34, as desired, and a nozzle 33 can be used at the inlet 32 and/or outlet 34 to facilitate connections to fluid handling systems or to direct fluid flow in the chamber 30.

The tub 28 can be affixed to the cooling metal layer 16 such that the cooling metal layer 16 forms a part of the chamber 30, so fluid flowing through the chamber 30 would contact and pass directly over the cooling metal layer 16. The cooling metal layer 16 can be machined to form an enhanced surface 35, where the enhanced surface 35 comprises fins 36, but it is also possible for the enhanced surface 35 to comprise pins 38 or other structures, as desired. In general, the tub 28 is connected to the cooling metal layer 16 such that the enhanced surface 35 is positioned within the chamber 30, so coolant will contact and flow directly past the enhanced surface 35. In some embodiments, no enhancements are made to selected portions of the cooling metal layer 16, so this unenhanced portion of the cooling metal layer 16 can be used to form a seal with the tub 28, which can help prevent coolant leaks. The chamber 30 maintains liquid coolant over the enhanced surface 35, but the chamber 30 also serves to contain the liquid coolant and thereby protect the electronic components 8, the electronic metal layer 18, and other components from direct contact with the liquid coolant. The chamber 30 is one portion of a liquid coolant containment system.

Enhancements primarily include fins 36 and pins 38 of various shapes and dimensions, but can also include other structures like hollow vertical circular protrusions, horizontal hollow boxes, or other shapes. Pins 38 include rectangular or round fingers extending from the cooling layer outer surface 20, but pins also include other shapes like pyramids or semi spheres. The enhancements can extend from the substrate 12 all the way to the tub 28, so the enhancements actually touch the inner surface of the tub 28, or the enhancements can extend to a distance short of the tub inner surface. Enhancements which touch the tub 28 can result in higher heat transfer rates than shorter enhancements, but they can also result in higher pressure drops which may lead to lower coolant flow rates, and lower coolant flow rates can decrease heat transfer rates. The shape and size of the enhancements can also affect the pressure drop and heat transfer rates.

Figure 5:
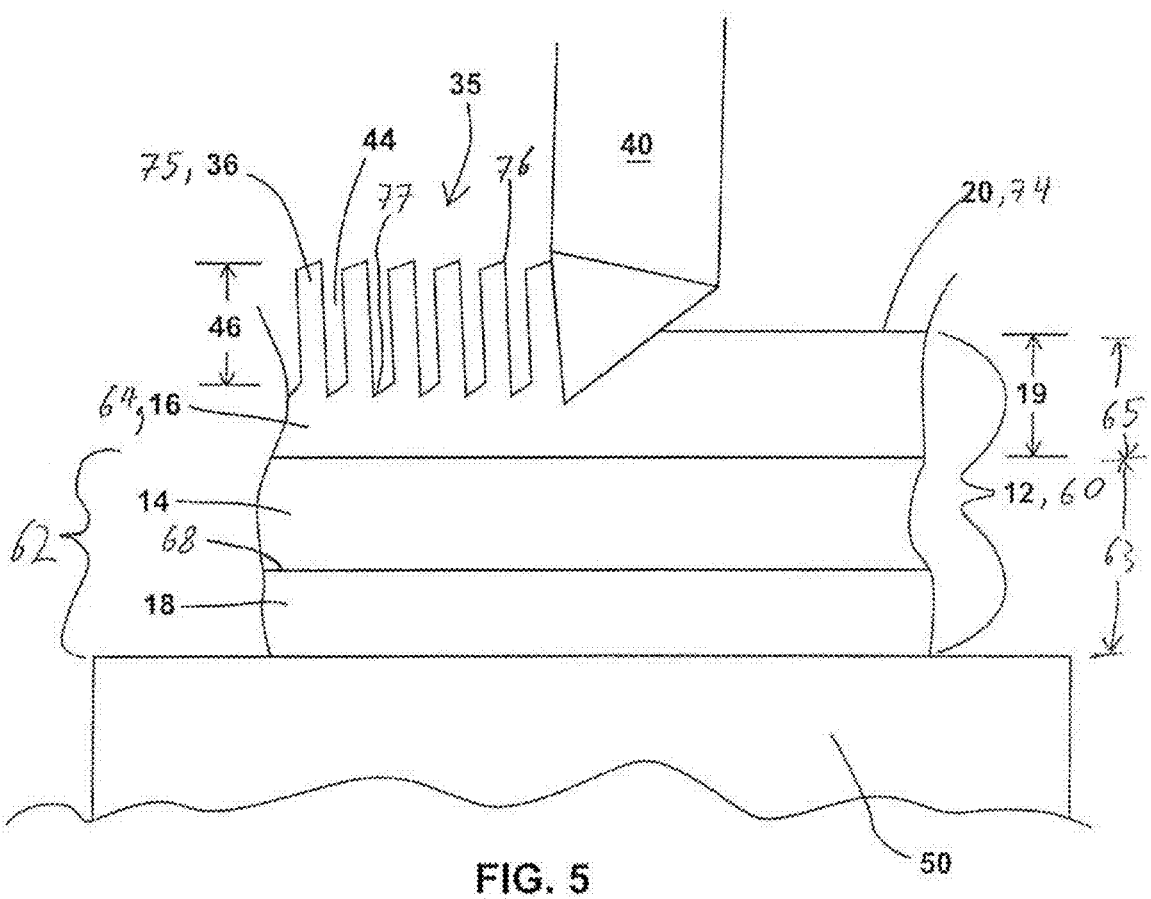
FIG. 5 is a side view of one embodiment of a tool forming fins from a substrate.
Figure 6:
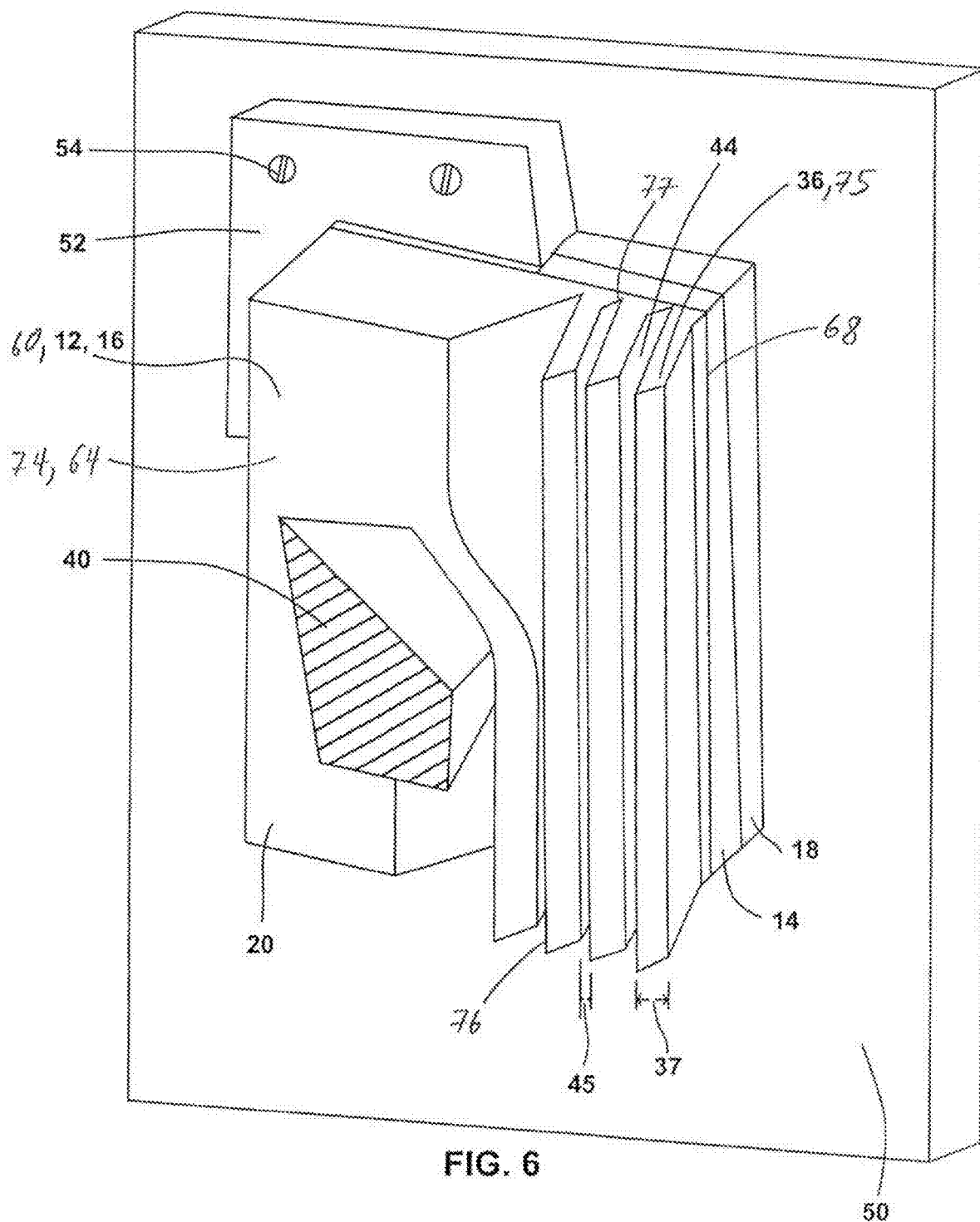
FIG. 6 is a perspective view of one embodiment of a tool forming fins from a substrate.

The fins 36 provide increased surface area for heat transfer, and also can increase turbulence in the coolant flow, both of which can increase heat transfer rates. Channels 44 are positioned between adjacent fins 36, and fluid can flow through the channels 44, as seen in FIGS. 5 and 6, with continuing reference to FIGS. 1-4. Fluid flowing through the channels 44 is in close proximity to the fins 36, and heat transfer between the fluid and the fins 36 can be rapid. Fins 36 have been used for some time to increase heat transfer, and the size, shape, and structure of the fin 36 can all impact the overall heat transfer rate. A wide variety of fin sizes, shapes and structures can be used on the cooling metal layer 16. Fin structures can include such things as platforms at the top of a fin 36, crenellated fin tops, side projections, etc. Pins 38 provide similar heat transfer improvements for similar reasons, and can also include structural modifications or enhancements.

The tub 28 or other structures forming part of the chamber 30 can be over essentially all of the cooling metal layer 16, but in other embodiments the chamber 30 will cover only a portion of the cooling metal layer 16, or there may be a plurality of different chambers 30 covering various different portions of the cooling metal layer 16. The size and spacing of the enhancements can vary between different chambers 30, and even within one chamber, as desired. There can be a plurality of enhanced surfaces 35 on one cooling metal layer 16, and each different enhanced surface 35 can comprise the same type of enhancement or different types of enhancements. The plurality of different enhanced surfaces 35 on a single cooling metal layer 16 can be discrete, separate "islands," within discrete, separate chambers 30. In alternate embodiments, the different enhanced surfaces 35 can be within the same chamber 30, where the different enhanced surfaces 35 can be connected, or the different enhanced surfaces 35 can be separated by a portion of the cooling metal layer 16 which is not enhanced. The tub 28 or other structures can be connected to the substrate 12 in a wide variety of methods, including but not limited to soldering, brazing, screws, pins, adhesive, and sonic welding. The connection between the components that form the chamber 30 should be secure to prevent coolant leaks.

Providing a chamber 30 with coolant flow directly contacting the cooling metal layer 16 at the enhanced surface 35 can improve heat transfer rates by reducing the number of interfaces and layers between an electronic component 8 and the coolant, as discussed above. Additionally, providing a thin substrate 12 with a directly connected cooling chamber 30 can reduce the space required for electronic components 8 for several reasons. First, a thin substrate 12 requires less room than a thicker substrate 12. Secondly, a cooling chamber 30 directly connected to the substrate 12 can reduce the total amount of material between the electronic component 8 and the coolant, and less material takes up less space. Thirdly, the use of liquid coolant can provide increased cooling over convective cooling with air flow, so electronic components 8 may be positioned closer together while still maintaining thermal control.

Surface Enhancements

The substrate 12 includes a ceramic tile 14 and a cooling metal layer 16, and machining can be used to enhance the cooling metal layer 16 to form an enhanced surface 35. The ceramic tile 14 is a brittle material, so any machining done to the substrate 12 should prevent flexing or bending of the substrate 12, and should also control other stresses that can fracture or break the ceramic tile 14. Generally, when one side of the substrate 12 is being machined, the entire opposite side should be firmly supported so all forces applied can be transferred straight through the substrate 12 directly to the supporting surface. While machining, the substrate 12 should be secured to prevent slipping or other motion. In one embodiment, the substrate 12 is flat, so the supporting surface should also be flat for machining. Additionally, the machining operation should be very precise, because all the various components of the substrate 12 can be thin, so there is little margin for error.

The substrate 12 can be secured to a machining base 50 by several techniques known to those skilled in the art. Some techniques for securing the substrate to the machining base 50 include securing a stop block 52 to the machining base 50, and abutting the substrate 12 against the stop block 52 such that the stop block 52 prevents the substrate 12 from slipping as the tool 40 passes through the cooling metal layer 16. Screws 54 can secure the stop block 52 to the machining base 50, but clamps, bolts, welding, or many other techniques can also be used. The substrate 12 can be further secured to the machining base 50 with clamps, but vacuum applied to the substrate surface contacting the machining base 50 can secure the substrate 12 in place without obstructing the substrate surface being machined.

The current invention includes a method of enhancing the cooling layer outer surface 20, and also a method for enhancing the electronic layer outer surface 22 if desired. The electronic layer outer surface 22 can be enhanced in the same manner as the cooling layer outer surface 20, so this description will only describe enhancing the cooling layer outer surface 20 with the understanding that the electronic layer outer surface 22 could be enhanced in the same manner.

Fins 36 can be formed on the cooling metal layer 16 using a process called micro deformation technology (MDT), which is described in U.S. Pat. No. 5,775,187, issued Jul. 7, 1998, and which is hereby incorporated in full into this description. In this process, the cooling metal layer 16 is sliced with a tool 40 without removing material from the cooling metal layer 16. The MDT process is different than a saw or router, which removes material as cuts are made, and is more similar to the cutting of meat with a knife.

The slicing of the cooling metal layer 16 is done with the tool 40. As the tool 40 contacts the material of the cooling metal layer 16, a fin 36 is cut into the cooling metal layer 16. The slicing of the fins 36 from the cooling metal layer 16 results in the fins 36 being monolithic with the cooling metal layer 16, which improves heat transfer as discussed above. The fins 36 are formed directly from the material of the cooling metal layer 16, so there is no joint or break between the fin 36 and the cooling metal layer 16.

The fins 36 are one embodiment of an enhanced surface 35. The cutting of the cooling metal layer 16 forms a channel 44 between adjacent fins 36, and can be done without removing material from the cooling metal layer 16. Preferably, there are no shavings produced in the formation of the fins 36. The tool 40 cuts fins 36 into the cooling metal layer 16, and the space produced as the tool 40 passes through the cooling metal layer 16 forces material in the fins 36 upwards. This cutting and deformation of the cooling metal layer 16 causes the fins 36 to rise to a fin height 46 which is higher than the original cooling layer outer surface 20. The cutting tool design, the depth of the cut, and the width of the fins 36 and channels 44 are factors which affect the fin height 46. The tool 40 is moved slightly in one direction for each successive cut, so each cut forms a fin 36 adjacent to the previously cut fin 36. This process is repeated until a bed of fins 36 has been produced.

Pins 38 are made by slicing across the fins 36 with a second series of cuts. The second set of slices can also use the MDT method, and raise the pins 38 to a pin height 48 greater than the fin height 46. As the slices are made, no material is removed from the cooling metal layer 16, so the moved material is instead directed into the remaining pin 38. This causes the remaining pin 38 to rise to a height higher than the material from which the pin 38 was cut. The second set of slices can be made at a wide variety of angles to the fins 36, including ninety degrees or an angle other than ninety degrees. Additionally, the incline angle of the pin 38 and/or the fin 36 can be manipulated by the angle of the tool 40 as the slices are made. A modification of the incline angle of the fin 36 can change the incline angle of the pin 38.

In an alternate embodiment, the fins 36 are made without using the MDT process, and the pins 38 are then formed from the fins 36 using the MDT process. In another alternate embodiment, the fins 36 are made using the MDT process, and the pins 38 are then formed from the fins 36 using a conventional cutting process different than the MDT process.

The fins 36 are cut at a specified fin width 37, with a specified channel width 45, so there are a predetermined number of fins 36 per centimeter. Similar specific dimensions can be set for pins 38. Many dimensions of the enhanced surface 35 can be controlled by specifying the tool design and settings for the machining operation used. The production of the tub 28 or comparable structures can be accomplished by traditional methods. This includes stamping, cutting, pouring, molding, machining and other standard metal working techniques.

The MDT cutting process can be performed on a CNC milling machine, a lathe, a shaper, or other machining tools. The cutting depth should not be so deep that the integrity of the ceramic tile 14 is compromised, and the cutting depth should be deep enough to produce a fin height 46 sufficient to achieve the desired heat transfer rate. Experience has shown a cutting depth of about 60 to 70 percent of the cooling metal layer thickness 19 can be used. In general, the tool 40 should cut into the cooling metal layer 16 to a depth less than the cooling metal layer thickness 19. Successful beds of fins 36 have been made with between about 20 to about 60 fins per centimeter (cm), but other fin densities are also possible. One example of fin dimensions on direct bonded substrates includes a cooling metal layer thickness 19, as measured before the fins 36 are cut, of 0.30 mm, and a fin height 46 of 0.53 mm, a fin width of 0.17 mm, and a channel width of 0.17 mm. As described above, the cooling layer outer surface 20 is determined either before the fins 36 are cut or at a point where no fins 36 are formed in the cooling metal layer 16. The fin height 46 is larger than the cooling metal layer thickness 19, and the fins 36 begin at a point within the cooling metal layer 16, so the fins 36 extend beyond the cooling layer outer surface 20. As described above, the pins 38 extend to a pin height 48 which is higher than the fin height 46 before the pins 38 were made. Therefore, the pins 38 extend beyond the cooling layer outer surface 20, similar to the fins 36.

In one embodiment, a lathe is used for machining blank substrates 12, where a substrate 12 is considered blank before the cooling metal layer 16 is enhanced. The lathe can have a disk-shaped face that is perpendicular to the axis of rotation, and one or more blank substrates 12 can be secured close to the outer edge of the face of a lathe. The blank substrates 12 can be set opposite each other to help balance the lathe face during rotation. The tool 40 can then be directed into the face of the lathe, essentially parallel to the axis of rotation of the lathe, for machining of the substrates 12. The tool 40 is slowly moved either towards the axis of rotation of the lathe, or away from the axis of rotation of the lathe, so the tool 40 contacts the blank substrates 12 at different positions with every rotation of the lathe. In this manner, several blank substrates 12 can be machined simultaneously on a single lathe. Machining near the edge of the face of lathe produces fins 36 which are not straight, but which have a slight curve determined by the distance of the substrate 12 from the lathe's axis of rotation. Border areas can then be machined flat for mounting a tub 28 sealed to the cooling metal layer 16, if desired.

Clad Metal Fundamentals

If two different components are metals, the resistance to heat flow across the interface can be significantly reduced if there is a metallurgical bond at the interface. In this description, the term "metallurgical bond" means the different metals at the interface of two different metals actually share electrons. Many bonds are mechanical bonds, where the different metals or other materials interlock at the interface, but the different metals do not share electrons in a mechanical bond. A metallurgical bond offers far less resistance to heat flow than a mechanical bond. It is generally more difficult to form a metallurgical bond than a mechanical bond, and many bonding techniques only form mechanical bonds.

Two separate metal components can be metallurgically bonded by a process called cladding. In this description, "clad" metals are defined as metals that are metallurgically bonded together at the interface, regardless of whether the clad metals are the same or different materials. The cladding process generally involves subjecting the two metals to very high pressures, and sometimes high heat is combined with the high pressures. Other cladding processes are also possible. There are practical limits to the thickness of a metal that can be clad to another metal object, so clad metals are often relatively thin coatings. For example, it is difficult to clad aluminum to copper at more than about 3 millimeters thickness.

Two clad metals can be differentiated from two metals that are mechanically connected, because the metallurgical bond is structurally different than a mechanical bond. For instance, there are essentially no pores in a metallurgical bond for ingress of water or air, but there generally are pores in a mechanical bond, because the two materials are merely interlocked. The porosity at the interface can be measured, and this can differentiate a metallurgical bond from a mechanical bond. A metallurgical bond can also be differentiated from a mechanical bond by measuring the heat transfer across the interface, and comparing this to known standards.

The metallurgical bond is much stronger than a mechanical bond between the two metals. In fact, the metallurgical bond is often so strong that dissimilar metals with different coefficients of thermal expansion will not delaminate during thermal cycling. Therefore, electronic systems with clad materials will generally have better reliability and a longer service life than comparable equipment with mechanically bonded materials.

Electronic Components with Base Plates

Figure 7:
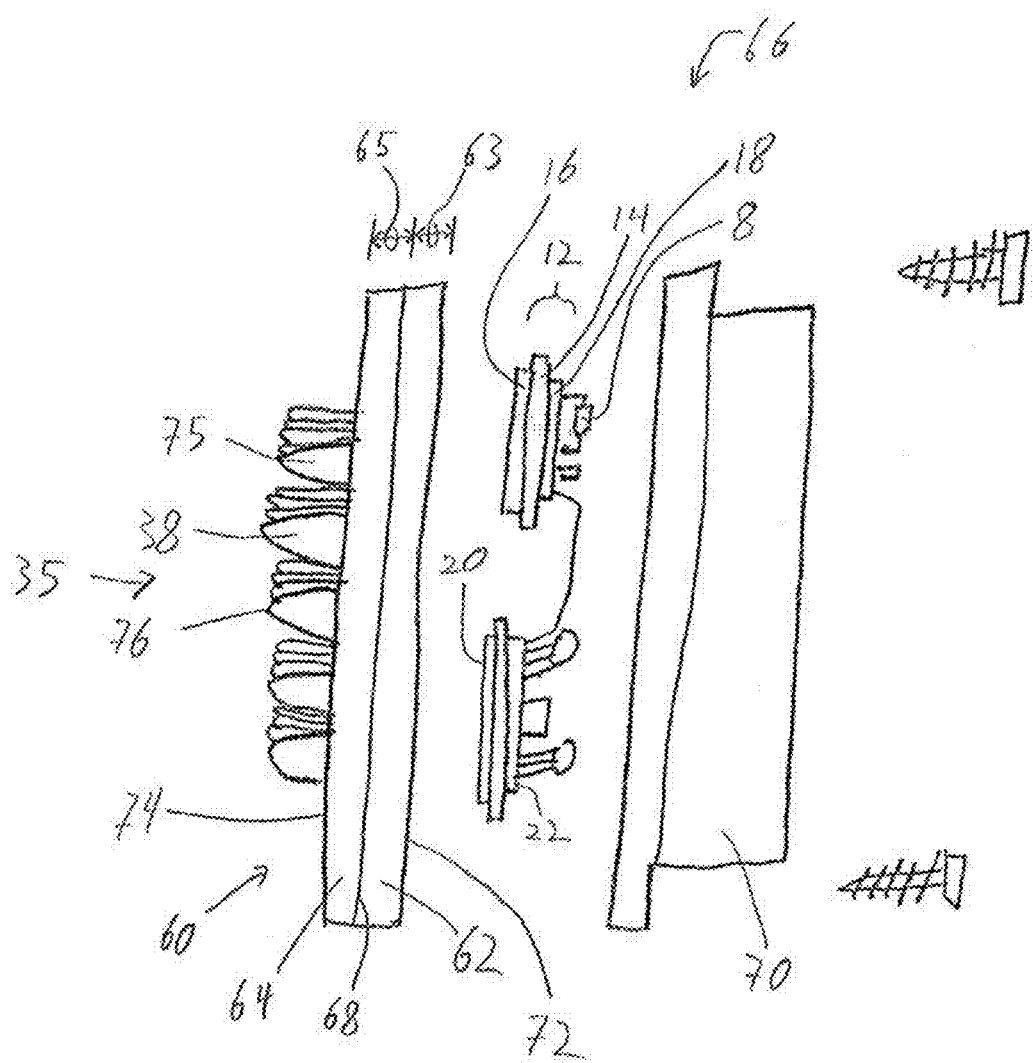
FIG. 7 is an exploded side view representative of an IGBT.

A base plate 60 can be used with various electronic components, as seen in FIG. 7, with continuing reference to FIGS. 1-6. The base plate 60 in FIG. 7 is shown as a part of an IGBT, but base plates 60 can also be used with other electronic components, such as inverters or diodes. IGBT cooling is described as an example, but it should be understood that base plate cooling can apply to other electronic components as well. A metallic base plate 60 can be made with two or more different metal layers which are clad together. In general, a clad metallic base plate 60 will have at least a first metal layer 62 with a first metal layer depth 63, and a second metal layer 64 with a second metal layer depth 65, but the base plate 60 may have a three or more metal layers, and the base plate 60 may have coatings as well. It is also possible for the base plate 60 to have a clad interface 68 between two layers, and a mechanical interface between two different layers. In this description, the first and second metal layers 62, 64 are clad together at an interface 68. Insulated Gate Bipolar Transistors 66, also called IGBTs 66, are one type of electronic component that can benefit from liquid cooling systems. Many IGBTs 66 include an electronic substrate 12, which can have copper or other metals directly bonded or directly plated to a ceramic tile 14 or other insulating material, as described above. An electronics component 8 can be attached to the base plate first metal layer 62, and an IGBT cover 70 can then be secured to the base plate 60 such that the electronic substrate 12 is positioned between the IGBT cover 70 and the base plate 60. A silicone gel or other fill material can also be positioned between the base plate 60 and the IGBT cover 70 to help minimize exposure to water, corrosives, and other materials. Base plate 60 has a first metal layer surface 72, and the substrate 12 and silicone gel generally contact the base plate first metal layer 62 at the first metal layer surface 72. The base plate 60 also has a second metal layer 64 with a second metal layer surface 74 opposite the first metal layer surface 72. The second metal layer surface 74 can be a component of a cold plate for cooling an electronic component, where liquid coolant flows directly over the second metal layer surface 74. The first metal layer 62 comprises a first metal, and the second metal layer 64 comprises a second metal different than the first metal.

In one embodiment, the first metal is copper, and the second metal is aluminum. This combination can provide the desirable heat transfer properties of copper and the ability to easily solder a copper cooling metal layer 16 or other copper electronic component 8 directly to the first metal layer surface 72. This combination also provides the light weight, relatively low cost, and corrosion resistance of aluminum for the second metal layer surface 74, which may be exposed to glycol solutions for cooling. The copper first metal has the same coefficient of thermal expansion as copper components connected to it, and the use of the same or similar metals reduces corrosion issues from connecting dissimilar metals. However, other metal combinations are also possible, such as a copper first metal layer 62 and a steel second metal layer 64, a steel first metal layer 62 and a titanium second metal layer 64, or a wide variety of other possible options. Some solid copper base plates 60 can have nickel plating on any surfaces that contact glycol to reduce corrosion, and cladding can reduce or eliminate the need for nickel plating. Nickel is heavier than aluminum, more expensive, and the interface of a plated material generally does not transfer heat as well as the interface 68 of a clad material, because plating forms a mechanical bond. The process for creating an enhanced surface 35 as described above, and as shown in FIGS. 5 and 6 (with continuing reference to FIGS. 1-4 and 7), is essentially the same for clad base plates 60 as for direct bonded substrates 12. The factors, considerations, methods and results described above for machining the substrate 12 also apply to machining the base plate 60. When referring to the Figures, the cooling metal layer 16 of the substrate 12 is comparable to the second metal layer 64 of the base plate 60, and the first metal layer 62 of the base plate 60 is comparable to the combination of the ceramic tile 14 and the electronic metal layer 18 of the substrate 12. The base plate 60 may have three or more layers clad or joined together, but it is also possible for the base plate 60 to have only two layers, so the viewer can consider the ceramic tile 14 and electronic metal layer 18 as one single layer comparable to the first metal layer 62 of the base plate 60, despite the fact that the ceramic tile 14 and electronic metal layer 18 are shown as separate layers.

A tool 40 can be used to machine a base plate 60 to produce fins 36 having a fin width 37, or pins 38. There is a channel 44 between adjacent fins 36, with a channel width 45, and the fins 36 will have a fin height 46 while the pins 38 will have a pin height 48. The base plate 60 will be machined on a machining base 50, and a stop block 52 can be used to minimize movement and aid in positioning of the base plate 60. The stop block 52 can provide an additional benefit for clad base plates 60. A stop block 52 that extends upward to near the interface 68, and preferable slightly above the interface 68, can help support the interface 68 during the machining process to reduce delamination between the first and second metal layers 62, 64. Therefore, the first and second metal layers 62, 64 remain clad together during and after the cutting of the fins 36 or pins 38. Screws 54 or other connection devices can be used to secure the stop block 52 to the machining base 50, as described above. This can provide an enhanced surface 35 on the base plate 60.

The enhanced surface 35 of the base plate 60 will have a fin height 46 or a pin height 48 that is greater than the second metal layer depth 65. The enhancements 75, which are the fins 36 or the pins 38, will have an enhancement tip 76 that extends further from the interface 68 than the second metal layer surface 74, and this refers to the second metal layer surface 74 when the enhancements 75 are cut, and not after any additional machining to reduce the second metal layer surface 74. This is true because the MDT process creates enhancements 75 that extend above the surface from which the enhancements 75 were formed. Applicant has actually produced fins 36 standing 5 millimeters tall from an aluminum second metal thickness of 2.7 millimeters. The fins 36 or pins 38 will be entirely defined within the second metal layer 64, and therefore within the second metal, such that an enhancement base 77 does not penetrate the interface 68. The enhancement base 77 is the portion of the fins 36 or pins 38 that is closest to the clad interface 68, and the enhancement base 77 is at the opposite end of the enhancement 75 from the enhancement tip 76. The fins 36 or pins 38 are monolithic with the second metal layer 64, and therefore with the second metal, as described above.

Figure 8:
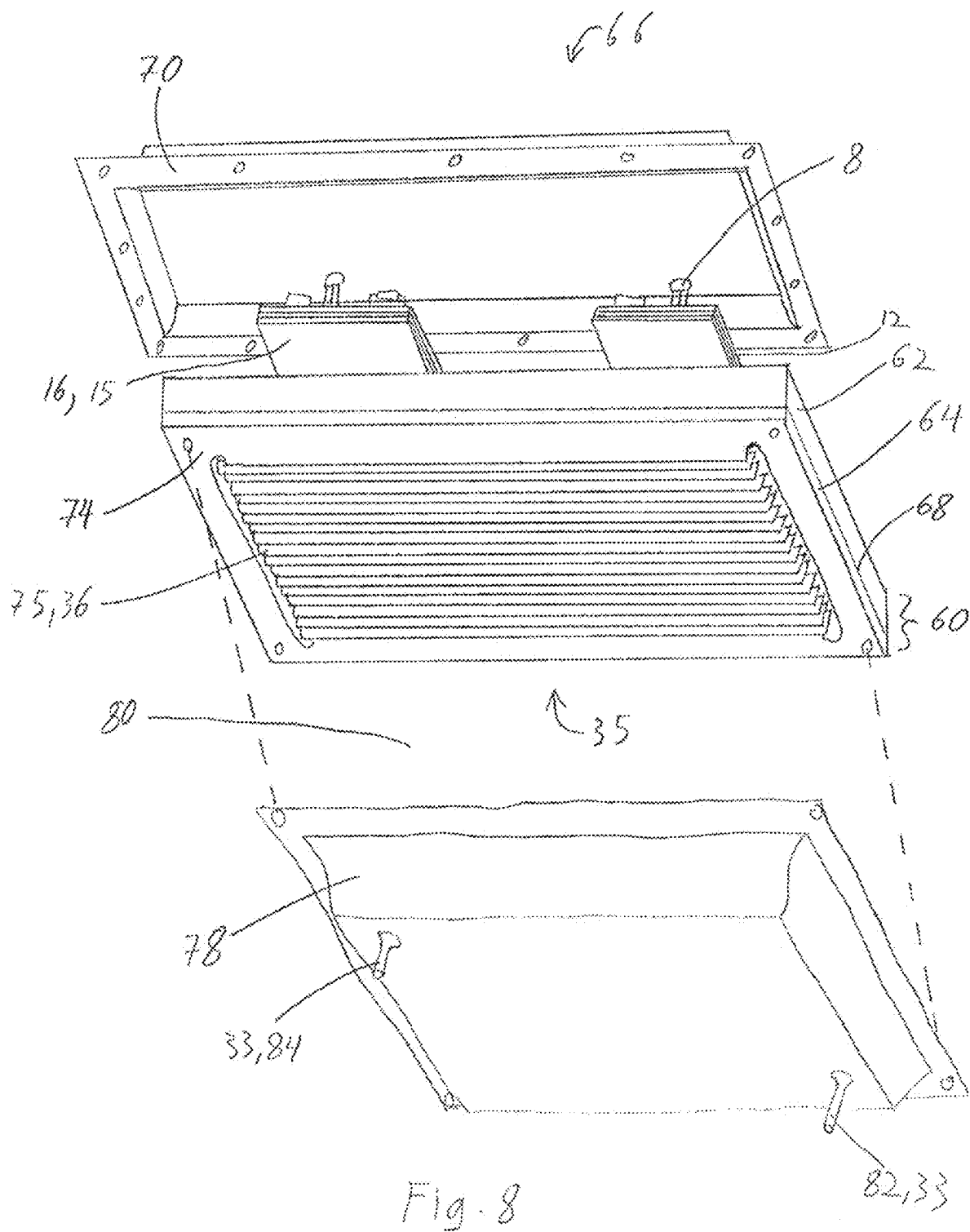
FIG. 8 is an exploded perspective view representative of an IGBT with liquid cooling system formed onto the base plate.

A basin 78 can be attached to the base plate 60 such that an enclosure 80 is formed between the basin 78 and base plate 60, as seen in FIG. 8 with continuing reference to FIGS. 1-7. The basin 78 is positioned such that the enhancements 75 formed in the second metal layer 64 are positioned within the enclosure 80. An entrance 82 and an exit 84 penetrate the enclosure 80, so liquid coolant can enter the enclosure 80 through the entrance 82 and leave the enclosure 80 through the exit 84. Therefore, the entrance 82 and exit 84 are in fluid communication through the enclosure 80. The basin 78 can be positioned such that only the second metal layer 64 of the base plate 60 is within the enclosure 80, and the first metal layer 62 is not within the enclosure 80. There can be nozzles 33 at the entrance 82 and exit 84, similar to the nozzles 33 for the inlet 32 and outlet 34 for the substrate 12. As discussed above, the options for producing varying enhancement 75 designs for the cooling chamber 30 of the substrate 12 also apply to the enhancements 75 and cooling enclosure 80 of the base plate 60, including multiple basins 78 on a single base plate 60, and varying enhancement structures at different places on the base plate 60.

The fins 36 or pins 38 formed on the base plate 60 create a large surface area that is monolithic with the second metal layer 64, which provides good heat transfer. The fins 36 or pins 38 also tend to increase the turbulence in liquid coolant flow, which also increases heat transfer.

Figure 9A:
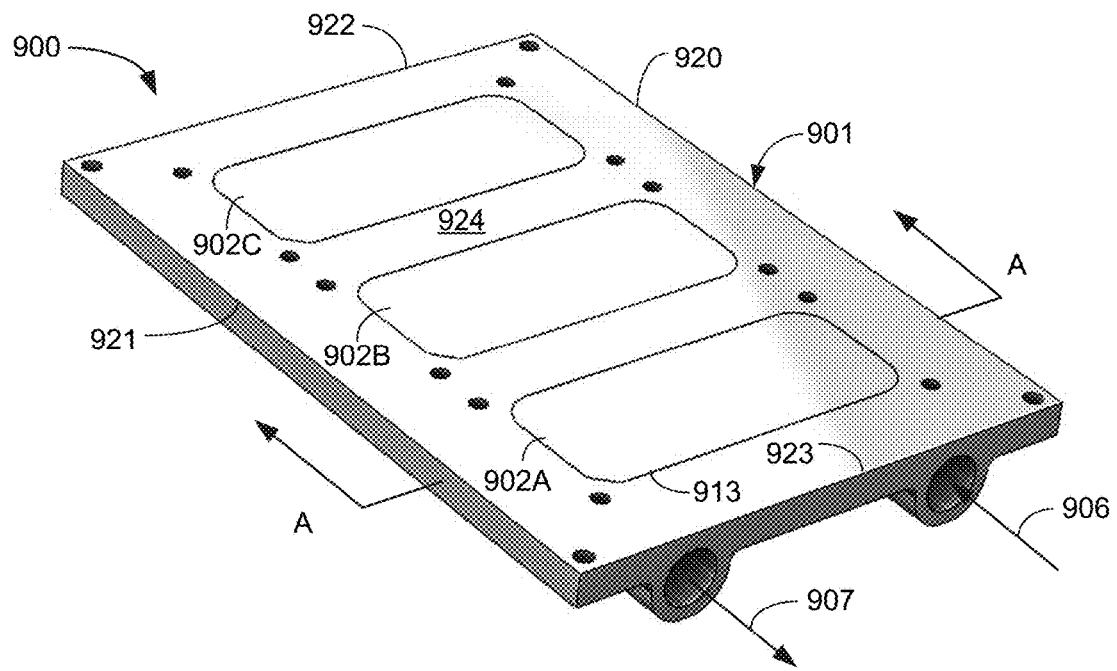
FIG. 9A is a perspective view of a liquid cooled coldplate according to an alternative embodiment of the present disclosure.

FIG. 9A depicts a liquid cooled coldplate 900 according to an alternative embodiment of the present disclosure. The coldplate 900 comprises a tub 901 with an inlet port 906 and an outlet port 907. The tub is essentially a manifold for containing and moving cooling fluid to cool electronics. The tub 901 is formed of aluminum in one embodiment, but could be formed of other materials, such as copper. The tub 901 is generally rectangular in shape in the illustrated embodiment, with opposed long sides 920 and 921 opposite to and substantially perpendicular to opposed short sides 922 and 923. Cold fluid (not shown) enters the tub 901 through the inlet port 906, runs through the tub as further discussed herein, and exits the outlet port 907. In the illustrated embodiment, the inlet port 906 and outlet port 907 each comprise a generally cylindrical opening that extends through the tub, as further discussed herein. In other embodiments, the inlet port 906 and outlet port 907 may be shaped other than cylindrically; for example, the inlet port 906 and outlet port 907 may be ovally shaped. In the illustrated embodiment, the tub 901 is formed from extrusion, but may be formed by machining in other embodiments.

A top surface 924 of the tub 901 receives a plurality of plates 902A, 902B, and 902C. In the illustrated embodiment, the tub 901 has three plates 902A, 902B, and 902C, though other numbers of plates may be present in other embodiments. Top surfaces of the plates 902A, 902B, and 902C are generally flush with the top surface 924 of the tub 901. Pockets 913 recessed into the top surface 924 of the tub 901 receive the plates 902A, 902B, and 902C. In the illustrated embodiment, the pockets are machined into the tub using top down machining. Top surfaces of the plates 902A, 902B, and 902C receive IGBT electronics modules (not shown), and the coldplate 900 cools the electronics.

To maximize the corrosion protection of an aluminum cold plate during the cooling application, both the tub 901 and the cooling plates 902A, 902B and 902C can be plated with an electroless nickel coating prior to the assembly. After the coldplate 900 is assembled by friction stir welding or other joining approaches, the external surfaces of the finished coldplate 900 can be re-plated with electroless nickel coating. This double-plating should provide additional corrosion protection to a cold plate when an aggressive coolant, such as deionized water, is used as a coolant.

Figure 9B:
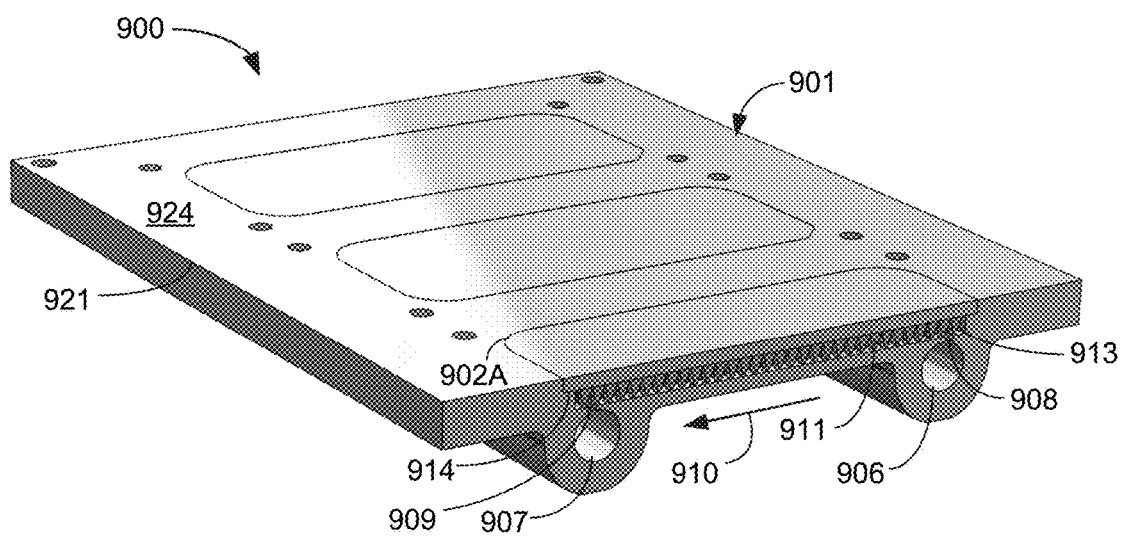
FIG. 9B is a perspective section view of the cold plate of FIG. 9A, taken along section lines A-A of FIG. 9A.

FIG. 9B is a cross-sectional view of the coldplate 900 of FIG. 9A, taken along section lines A-A of FIG. 9A. The plate 902A is received in the pocket 913 that is recessed into the top surface 924 of the tub 900. Pins 911 formed on the lower surface of the plate 902A create a large surface area that is monolithic with the plate 902A, which provides good heat transfer. The pins 911, which are formed in the manner discussed herein, extend downwardly into the pocket 913, and are in fluid communication with the pocket 913, the inlet port 906, and the outlet port 907. The plate 902A rests on a ledge 914 that extends around a perimeter of the pocket 913. There are no pins 911 on the edges of the plate 902A that would impede the plate 902A from resting on the ledge 914 such that the top surface of the plate 902A is flush with the top surface 924 of the coldplate, as discussed herein.

The inlet port 906 and outlet port 907 each extend longitudinally down the tub 901 near opposite long edges of the tub 901. The inlet port 906 and outlet port 907 are disposed beneath opposed ends of the pocket 913, to enable fluid to flow from the inlet port 906, through the pocket 913, to the outlet port 907 in the direction indicated by directional arrow 910.

An inlet slot 908 in the tub 901 permits fluid (not shown) to flow from the inlet port 908, through the pockets 913 and to the outlet port 907, via an outlet slot 909. The pockets 913 are thus in fluid communication with the inlet port 906 and the outlet port 907. The inlet slot 908 and outlet slot 909 are discussed further with respect to FIG. 10.

The pockets 913 provide balanced parallel cooling, in that fluid entering the inlet port 906 is split between parallel channels (the three pockets 913 in the illustrated embodiment), and rejoined at the outlet port 907. The flow rate in parallel channels can be tuned to make the flow balanced by sizing the width and/or size of the slots. This ensures that the surface temperatures of the plates 902A, 902B and 902C are uniform.

Figure 10:
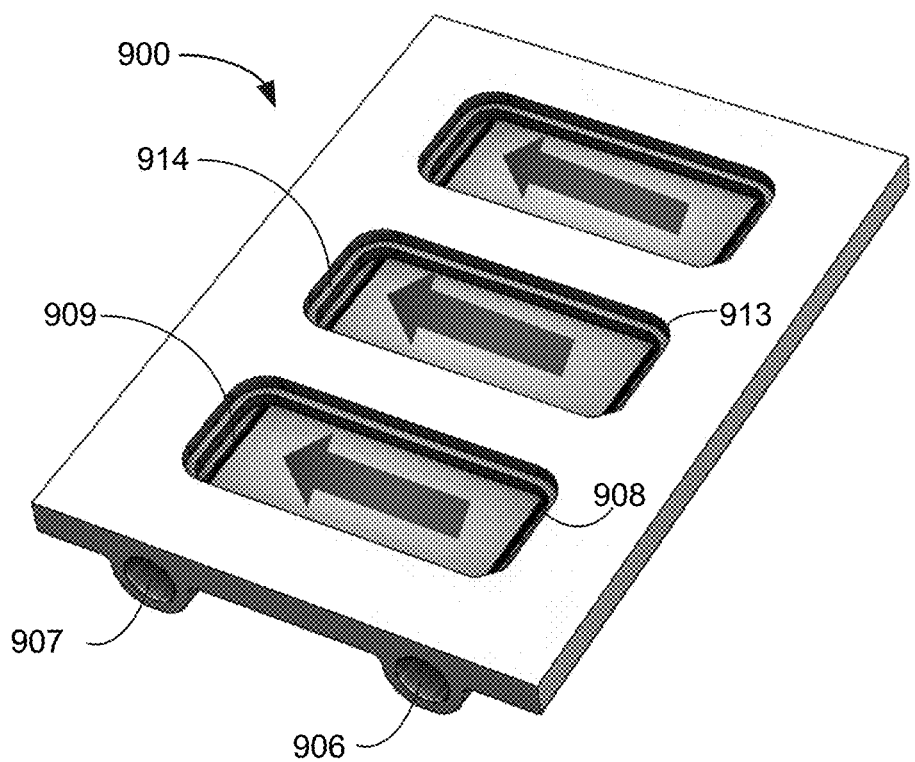
FIG. 10 is a perspective view of the cold plate of FIG. 9A, before the finned plates are installed.

FIG. 10 is a perspective view of the coldplate 900 of FIG. 1, shown without the plates 902A, 902B, and 902C. The inlet slot 908 and outlet slot 909 extend longitudinally along the tub, generally over the inlet port 906 and outlet port 907, and only in the footprint of the pockets 913. In this regard, the slots 908 and 909 do not extend the length of the tub 901 in the illustrated embodiment. The inlet slot 908 is parallel with and in fluid communication with the inlet port 906, and the outlet slot 909 is parallel with and in fluid communication with the outlet port 907.

Each pocket 913 is generally rectangular, and in the illustrated embodiment has rounded corners. The ledge 914 extends around the perimeter of the pocket 913, stepped in and downwardly from the pocket 913, and receives the plates 902 (FIG. 9A), as discussed above. In this regard, the lower surface of the plates 902 rests on the ledge such that the upper surface of the plates is generally flush with the surface 924 of the tub 901. In the illustrated embodiment, the ledge 914 has rounded corners.

Figure 11:
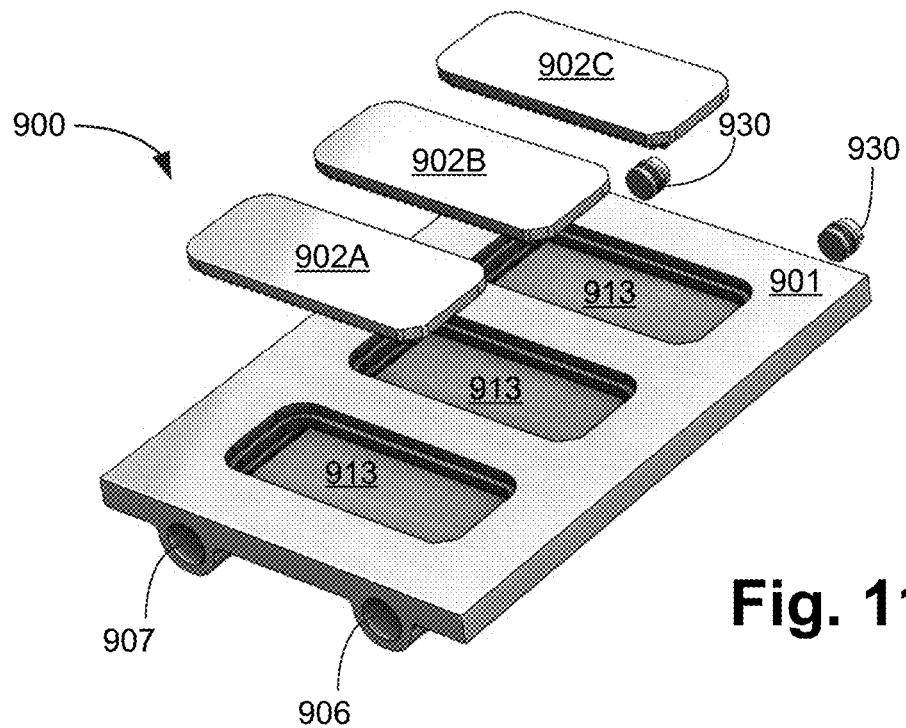
FIG. 11 is an exploded perspective view of the cold plate of FIG. 9A.

FIG. 11 is an exploded view of the coldplate of FIG. 9A, showing the plates 902A, 902B and 902C before installation into the pockets 913. Plugs 930 stop up the openings (not shown) that are coextensive with the inlet port 906 and outlet port 907, when the coldplate 901 is formed from extrusion. The plugs 930 can be installed using friction stir welding, can be pressed in, or can be threaded in with sealant. After the plates 902 are installed into the pockets 913, the plates 902A, 902B and 902C are affixed within the pockets 913 by friction stir welding, brazing or other means of attachment. After the plates are affixed, the top surface is fly cut to remove joining flash or the like, and to create a thermally optimal surface finish and flatness. Mounting holes (not shown) for mounting electronics are thereafter formed into the surface.

Figure 12:
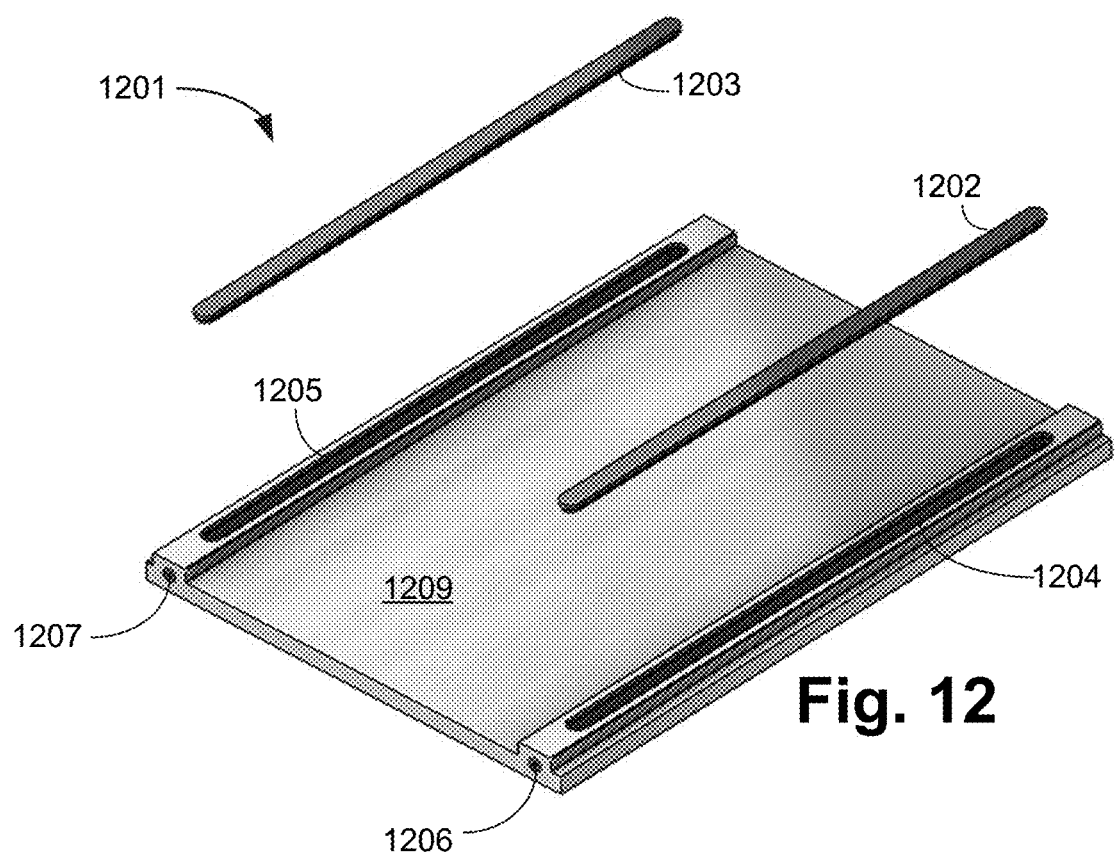
FIG. 12 is an exploded view of a coldplate tub according to an alternative embodiment of the present disclosure.

FIG. 12 is an exploded view of an alternate embodiment of a tub 1201, where the tub 1201 is machined instead of extruded. In this embodiment, openings 1204 and 1205 for the inlet port 1206 and outlet port 1207 are machined from the tub bottom side 1209, and plates 1202 and 1203 plug the openings and are friction stir welded in place. This embodiment may be desired when extruded or gun-drilled tubs are not possible.

Figure 13:
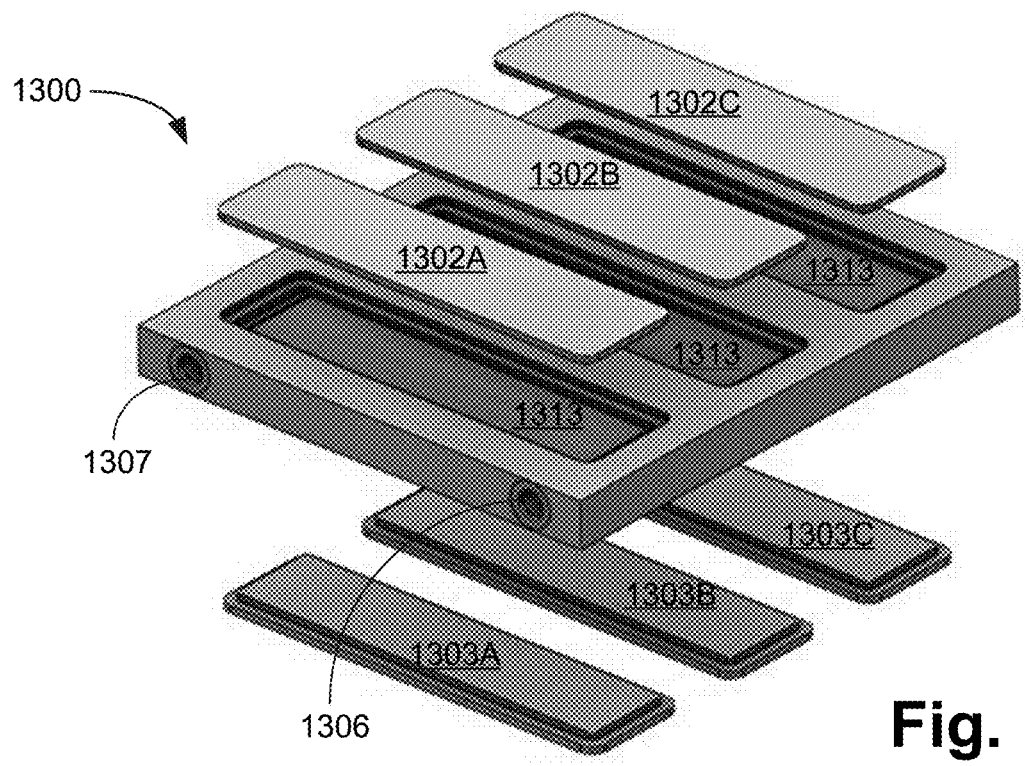
FIG. 13 is an exploded view of a double-sided coldplate according to an alternative embodiment of the present disclosure.

FIG. 13 is an exploded perspective view of a double-sided coldplate 1300, wherein a plurality of plates 1302A, 1302B, and 1302C are disposed on a top side 1324 of a tub 1301, and a plurality of plates 1303A, 1303B, and 1303C are disposed on a bottom side 1325 of the tub 1301. Each of the plates 1302A, 1302B, 1302C, 1303A, 1303B, and 1303C comprises a pinned plate formed using the methods discussed herein. The pinned sides of the plates 1302A, 1302B, 1302C, 1303A, 1303B, and 1303C all face inwardly, towards the tub 1301, and are in fluid communication with the pockets 1313 (which are on both sides of the tub 1301), inlet port 1306, and outlet port 1307. Electronics modules may be attached to all of the plates 1302A, 1302B, 1302C, 1303A, 1303B, and 1303C.

Figure 14:
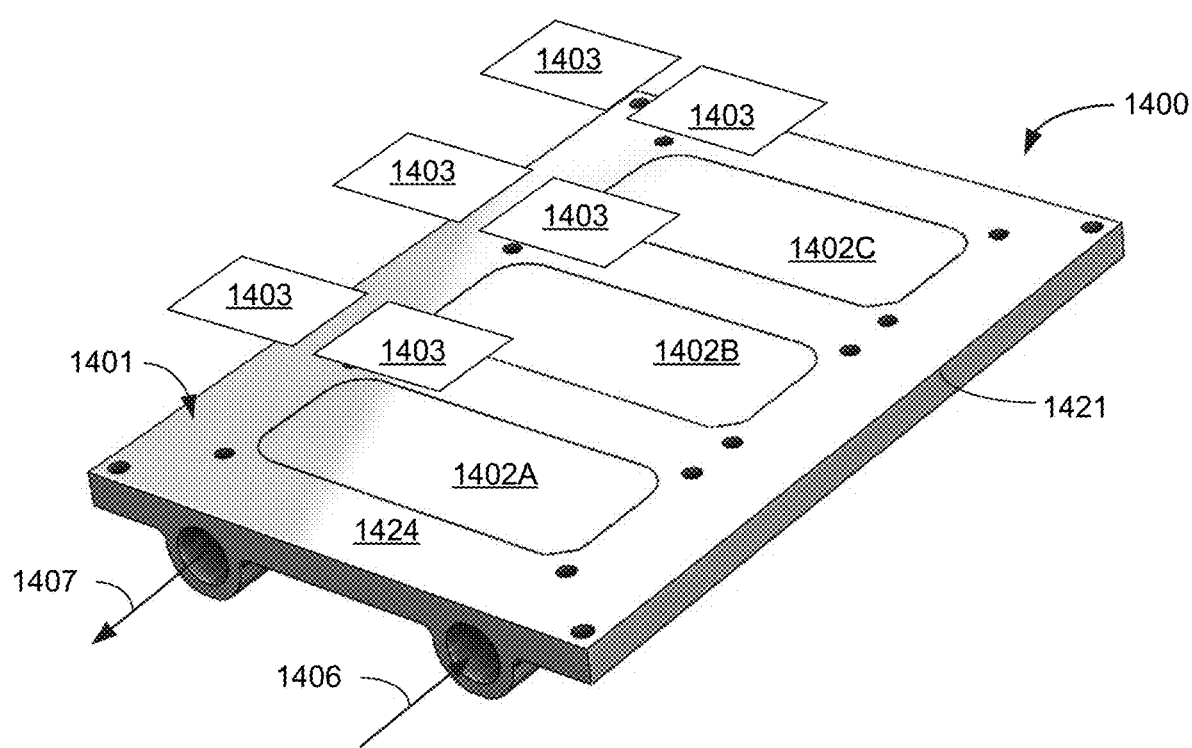
FIG. 14 is a partially exploded view of a liquid cooled coldplate according to an alternative embodiment of the present disclosure.

FIG. 14 is a partially exploded view of a liquid cooled coldplate 1400 according to an alternative embodiment of the present disclosure. The coldplate 1400 comprises a tub 1401 with an inlet port 1406 and an outlet port 1407. When in use with the coldplate 1400, the tub 1401 is essentially a manifold for containing and moving cooling fluid to cool electronics. A similar tub is discussed above with respect to FIG. 9A. In use of the tub 1401, cold fluid (not shown) enters the tub 1401 through the inlet port 1406, runs through the tub as further discussed herein, and exits the outlet port 1407.

A top surface 1424 of the tub 1401 receives a plurality of plates 1402A, 1402B, and 1402C. In the illustrated embodiment, the tub 1401 has three plates 1402A, 1402B, and 1402C, though other numbers of plates may be present in other embodiments. Top surfaces of the plates 1402A, 1402B, and 1402C are generally flush with the top surface 1424 of the tub 1401. Pockets (not shown) recessed into the top surface 1424 of the tub 1401 receive the plates 1402A, 1402B, and 1402C. Top surfaces of the plates 1402A, 1402B, and 1402C receive a plurality of IGBT electronics modules 1403, and the coldplate 1400 cools the electronics. In FIG. 14, the IGBT electronics modules 1403 are shown in exploded view, before the IGBT electronics modules 1403 have been affixed to the plates 1402A, 1402B, and 1402C.

In one method for forming the coldplate 1400, the IGBT electronics modules 1403 are attached to the plates 1402A, 1402B, and 1402C via conduction through a hotplate. In another method for forming the coldplate 1400, the IGBT electronics modules 1403 are attached to the plates 1402A, 1402B, and 1402C by circulating a hot fluid (not shown)

through the tub 1401 while the IGBT electronics modules 1403 are pressed to the plates 1402A, 1402B, and 1402C and the hot fluid solders the IGBT electronics modules 1403 to the plates. This is an efficient method for attaching electronics to the coldplate. The hot fluid flowing through the coldplate 1400 achieves a surface temperature on the 1402A, 1402B, and 1402C sufficient to solder the electronics to the coldplate.

While the invention has been described with respect to a limited number of embodiments, those skilled in the art, having the benefit of this disclosure, will appreciate that other embodiments can be devised which do not depart from the scope of the invention as disclosed here. Accordingly, the scope of the invention should be limited only by the attached claims.

What is claimed is:

1. A method of producing a liquid cooled coldplate, the method comprising:
   forming a tub from metal, the tub comprising an inlet port, and outlet port, and a plurality of pockets, wherein the plurality of pockets are formed in a top surface of the tub and are in fluid communication with the inlet port and outlet port;
   forming a plurality of cooling plates by slicing fins into flat metal plates with a tool to form an enhanced surface, where the tool slices into the cooling metal layer to a depth less than the cooling metal layer thickness, and where the slicing step forces sliced material upwards, the slicing step forming the fins to a fin height extending beyond an outer surface of the cooling metal layer, then slicing across the fins at an angle to form pins which extend beyond an outer surface of the cooling plates;
   installing each cooling plate into a pocket such that a chamber is formed between the tub and the cooling plate and the enhanced surface is within the chamber and in fluid communication with the chamber, the inlet port, and the outlet port;
   installing electronic components onto the cooling plate on a side opposite to the enhanced surface.

2. The method of claim 1, wherein the step of installing the electronic components onto the cooling plate is performed by running a hot fluid into the inlet port, through the tub, and out of the outlet port, the hot fluid at a temperature sufficient to solder the electronic components onto the cooling plate.

3. The method of claim 1 wherein the step of forming the tub from metal comprises extruding the tub from aluminum.

4. The method of claim 1, wherein the angle is between 30 and 90 degrees.

5. The method of claim 1, further comprising forming an inlet slot between the inlet port and the pocket, whereby the inlet slot allows fluid to flow from the inlet port to the pocket.

6. The method of claim 5, further comprising forming an outlet slot between the outlet port and the pocket, whereby the outlet slot allows fluid to flow from the pocket to the outlet port.

7. The method of claim 6, whereby the inlet slots and the outlet slots are sized to provide substantially parallel flow rate in pockets.

8. The method of claim 1, wherein the step of forming the tub from metal comprises forming the tub from aluminum, and further comprises plating the tub with electroless nickel coating prior to the installation of the cooling plates onto the tub.

9. The method of claim 8, wherein the step of forming the plurality of cooling plates comprises forming the cooling plates from aluminum, and further comprises plating the cooling plates with electroless nickel coating prior to installing of the cooling plates onto the tub.

10. The method of claim 9, further comprising re-plating the coldplate with electroless nickel coating following installation of the cooling plates onto the tub.

11. The method of claim 1, further comprising smoothing the top surface after the cooling plates are installed into the tub.

12. The method of claim 11, whereby the step of smoothing the top surface is performed with a fly cutter.

13. The method of claim 11, further comprising forming mounting holes for mounting the electronics to the cooling plate.

14. A method of producing a liquid cooled coldplate, the method comprising:
    forming a tub from metal, the tub comprising an inlet port, and outlet port, and at least one pocket, wherein the at least one pocket is formed in an outer surface of the tub and is in fluid communication with the inlet port and outlet port;
    forming at least one cooling plate by slicing fins into a metal plate with a tool to form an enhanced surface, where the tool slices into a cooling metal layer of the metal plate to a depth less than the cooling metal layer thickness, and where the slicing step forces sliced material upwards, the slicing step forming the fins to a fin height extending beyond an outer surface of the cooling metal layer, then slicing across the fins at an angle to form pins which extend beyond an outer surface of the cooling plates;
    installing the cooling plate into the pocket such that a chamber is formed between the tub and the cooling plate and the enhanced surface is within the chamber and in fluid communication with the chamber, the inlet port, and the outlet port;
    installing electronic components onto the cooling plate on a side opposite to the enhanced surface.

15. The method of claim 14, wherein the step of installing the electronic components onto the cooling plate is performed by running a hot fluid into the inlet port, through the tub, and out of the outlet port, the hot fluid at a temperature sufficient to solder the electronic components onto the cooling plate.

16. The method of claim 14 wherein the step of forming the tub from metal comprises extruding the tub from aluminum.

17. The method of claim 14, wherein the angle is between 30 and 90 degrees.

* * * * *